(12) United States Patent
Mega et al.

(10) Patent No.: US 11,112,876 B2
(45) Date of Patent: Sep. 7, 2021

(54) OPERATION INPUT DEVICE

(71) Applicant: KABUSHIKI KAISHA TOKAI RIKA DENKI SEISAKUSHO, Aichi (JP)

(72) Inventors: Susumu Mega, Aichi (JP); Hidetaka Nomura, Aichi (JP); Kazuma Hatano, Aichi (JP); Akiko Hoshino, Aichi (JP); Seiji Hayashi, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 16/605,557

(22) PCT Filed: Apr. 5, 2018

(86) PCT No.: PCT/JP2018/014533
§ 371 (c)(1),
(2) Date: Oct. 16, 2019

(87) PCT Pub. No.: WO2018/193857
PCT Pub. Date: Oct. 25, 2018

(65) Prior Publication Data
US 2020/0133401 A1 Apr. 30, 2020

(30) Foreign Application Priority Data

Apr. 17, 2017 (JP) .............................. JP2017-081501
Dec. 25, 2017 (JP) .............................. JP2017-247907

(51) Int. Cl.
*G06F 3/02* (2006.01)
*H01H 13/78* (2006.01)
(Continued)

(52) U.S. Cl.
CPC ....... *G06F 3/0202* (2013.01); *H01H 13/7073* (2013.01); *H01H 13/78* (2013.01); *H03K 17/967* (2013.01)

(58) Field of Classification Search
CPC ................ H03K 17/967; G06F 3/0202; G06F 3/0219; G06F 3/023; G06F 3/0233; H03M 11/00;
(Continued)

(56) References Cited

U.S. PATENT DOCUMENTS 4,135,074 A * 1/1979 Malacheski ............ H01H 13/70
200/330
4,913,025 A * 4/1990 Nakano .................... G10H 1/34
381/109
(Continued)

FOREIGN PATENT DOCUMENTS

JP 57-50917 A 3/1982
JP 2007-287440 A 11/2007
(Continued)

*Primary Examiner* — Franklin D Balseca
(74) *Attorney, Agent, or Firm* — Roberts Calderon Safran & Cole, P.C.

(57) ABSTRACT

An operation input device includes an operation input unit that is configured to receive a tracing operation performed in a one-dimensional direction. The operation input unit includes a plurality of mechanical switches that are arranged side by side in an operation direction and each include an operation surface subjected to the tracing operation, the operation surface defining a curved surface along the operation direction.

12 Claims, 5 Drawing Sheets

(51) Int. Cl.
*H01H 13/7073* (2006.01)
*H03K 17/967* (2006.01)

(58) Field of Classification Search
CPC .................. H03M 11/02; H03M 11/04; H01H 13/7073; H01H 13/78
See application file for complete search history.

(56) References Cited

U.S. PATENT DOCUMENTS

| | | | |
|---|---|---|---|
| 5,041,819 A * | 8/1991 | Takeda | G06F 3/04892 |
| | | | 345/160 |
| 8,134,094 B2 * | 3/2012 | Tsao | H01H 13/88 |
| | | | 200/345 |
| 8,330,590 B2 | 12/2012 | Poupyrev et al. | |
| 9,962,608 B2 * | 5/2018 | Soelberg | G06F 13/102 |
| 2003/0169232 A1 * | 9/2003 | Ito | H01H 9/047 |
| | | | 345/156 |
| 2008/0024682 A1 * | 1/2008 | Chen | H04N 5/4403 |
| | | | 348/734 |
| 2009/0153374 A1 * | 6/2009 | Maw | H04M 1/23 |
| | | | 341/27 |
| 2010/0085169 A1 | 4/2010 | Poupyrev et al. | |

FOREIGN PATENT DOCUMENTS

| | | |
|---|---|---|
| JP | 2010-86471 A | 4/2010 |
| JP | 2011-65940 A | 3/2011 |
| JP | 2014-206924 A | 10/2014 |
| JP | 2016-184191 A | 10/2016 |

* cited by examiner

OPERATION INPUT DEVICE

CROSS-REFERENCE TO RELATED APPLICATIONS

The present application is a U.S. National Phase of PCT/JP2018/014533 filed on Apr. 5, 2018 claiming priority to Japanese Patent Application Nos. 2017-081501 filed on Apr. 17, 2017 and 2017-247907 filed on Dec. 25, 2017. The disclosure of the PCT Application is hereby incorporated by reference into the present Application.

TECHNICAL FIELD

The present invention relates to an operation input device.

BACKGROUND ART

An operational feeling providing device is known, which is provided with an operating portion having a two-layer structure composed of a conductor and an insulator, a sensor which detects at least a user's touch position as information indicating of user's touch to the insulator of the operating portion, a data processing unit to which detection information sent from the sensor is input and by which parameters of electrical signal to be output to the conductor are determined, and a tactile sensation control unit by which the electrical signal defined by the parameters determined by the data processing unit is output to the conductive layer so that friction between the insulator and the user is controlled (see, e.g., Patent Literature 1).

This operational feeling providing device can change the friction in response to the position or movement of a finger of the user and thereby provides various operational feelings to the user.

CITATION LIST

Patent Literature

Patent Literature 1: JP 2010-86471 A

SUMMARY OF INVENTION

Technical Problem

The operational feeling providing device disclosed in Patent Literature 1 has problems that when the user is wearing gloves, it is difficult to detect the user's touch position and also the user is less likely to experience an operational feeling based on the friction.

It is an object of the invention to provide an operation input device which allows easy input even when wearing a glove and also can provide an excellent operational feeling.

Solution to Problem

An operation input device in an embodiment of the invention comprises an operation input unit that is configured to receive a tracing operation performed in a one-dimensional direction, wherein the operation input unit comprises a plurality of mechanical switches that are arranged side by side in an operation direction and each comprise an operation surface subjected to the tracing operation, the operation surface defining a curved along the operation direction.

Advantageous Effects of Invention

According to an embodiment of the invention, it is possible to provide an operation input device which allows easy input even when wearing a glove and also can provide an excellent operational feeling.

DESCRIPTION OF EMBODIMENTS

Summary of the Embodiments

An operation input device in embodiments comprises an operation input unit that is configure to receive a tracing operation performed in a one-dimensional direction, wherein the operation input unit comprises a plurality of mechanical switches that are arranged side by side in an operation direction and each comprise an operation surface subjected to the tracing operation, the operation surface defining a curved surface along the operation direction.

This operation input device allows input regardless of wearing not wearing a glove and is configured that mechanical switches capable of giving feedback on the operation are arranged side by side and receive an input made by a tracing operation in a one-dimensional direction. That is, the operation input device allows easy input even when wearing a glove and also can provide an excellent operational feeling as compared to when detecting a tracing operation by a capacitive touch pad.

First Embodiment (General Description of Operation Input Device 1)

Figure 1A:
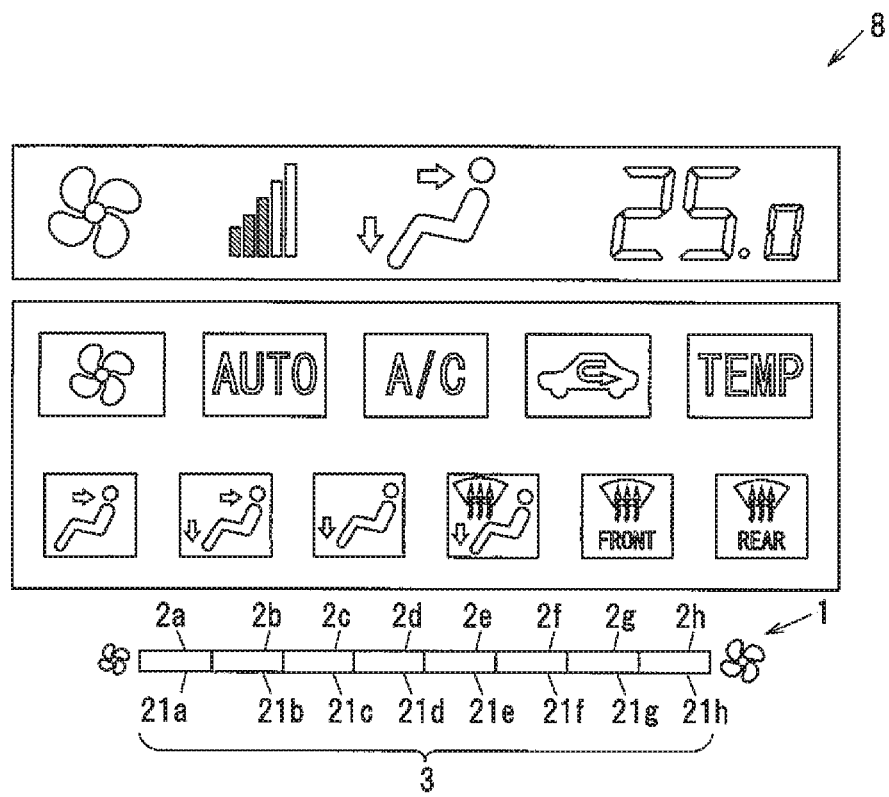
FIG. 1A is an explanatory diagram illustrating an air conditioner provided with an operation input device in the first embodiment.
Figure 1B:
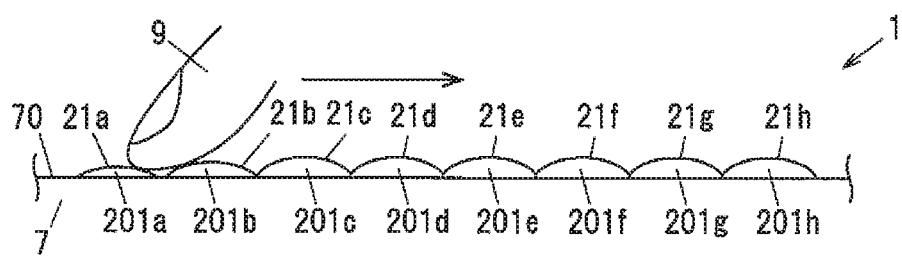
FIG. 1B is a side view showing an operation input unit.
Figure 1C:
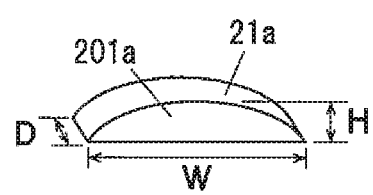
FIG. 1C is an explanatory diagram illustrating a shape of an operation button of a switch.
Figure 2A:
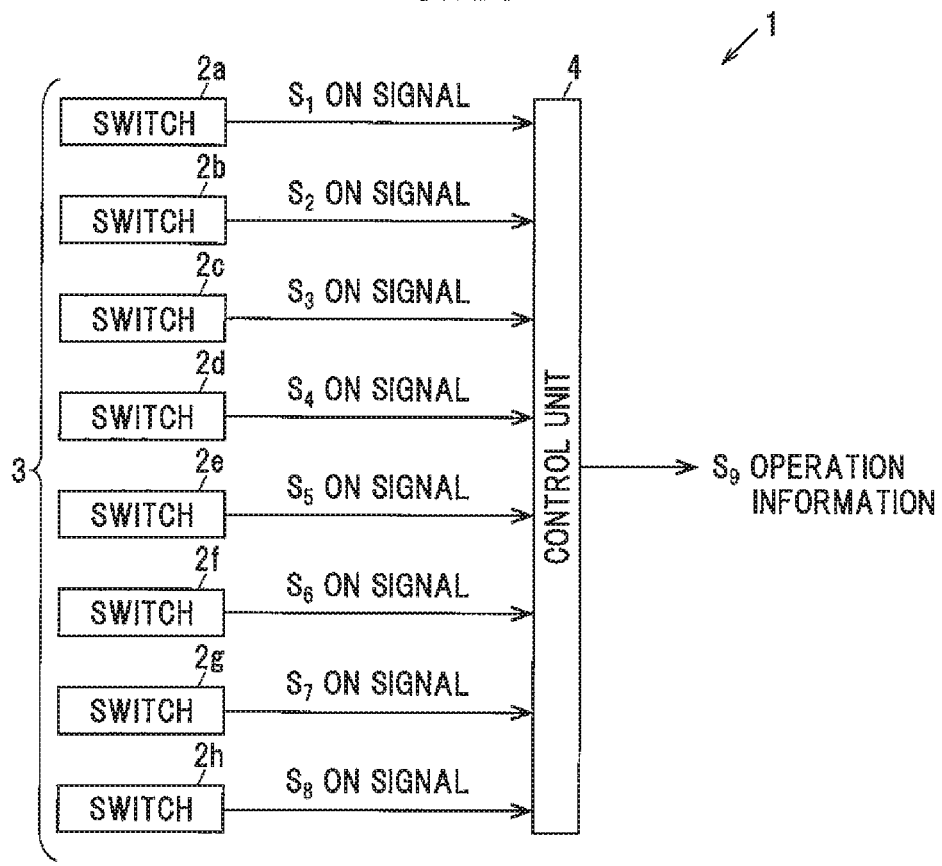
FIG. 2A is a block diagram illustrating the operation input device in the first embodiment.
Figure 2B:
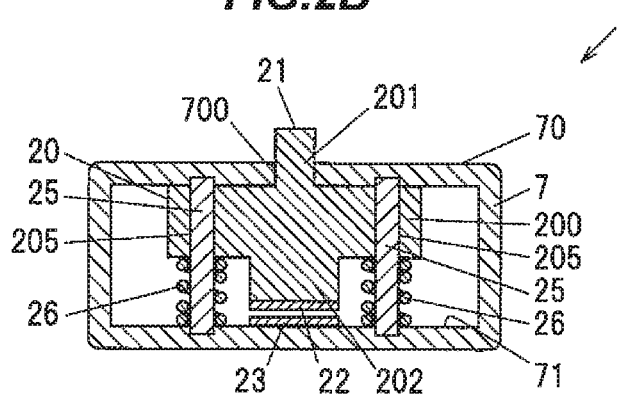
FIG. 2B is a cross sectional view showing the switch.
Figure 2C:
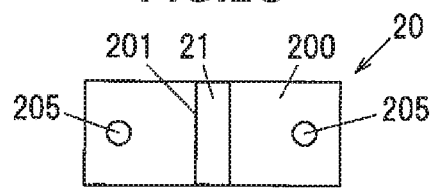
FIG. 2C is a top view showing an operating portion.

FIG. 1A is an explanatory diagram illustrating an air conditioner provided with an operation input device in the first embodiment. FIG. 1B is a side view showing an operation input unit and FIG. 1C is an explanatory diagram illustrating a shape of an operation button of a switch. FIG. 2A is a block diagram illustrating the operation input device in the first embodiment, FIG. 2B is a cross sectional view showing the switch and FIG. 2C is a top view showing an operating portion. In each of the drawings for the embodiments described below, a scale ratio may be different from an actual ratio. In addition, in FIG. 2A, flows of main signals and information are indicated by arrows.

An operation input device 1 is used as, e.g., an operation input portion for an electronic device to be operated, as shown in FIG. 1A. The electronic device is, e.g., an air conditioner or a navigation device mounted on a vehicle. The operation input device 1 in the first embodiment is used as, e.g., an operation input portion of an air conditioner 8. The operation input device 1 is arranged in a lateral direction in the paper plane of FIG. 1A, but is not limited thereto and may be aligned in a vertical direction, etc.

The operation input device 1 has, e.g., an operation input unit 3 which receives a tracing operation performed in a one-dimensional direction and is configured that plural mechanical switches (switch 2a to switch 2h) are arranged side by side in an operation direction and have operation surfaces (operation surface 21a to operation surface 21h) subjected to the tracing operation and curved along the operation direction, as shown in FIGS. 1A to 1C.

The operation input unit 3 in the first embodiment has the switch 2a to switch 2h as the mechanical switches as an example, but it is not limited thereto. The number of the mechanical switches is arbitrarily selected according to the intended use. In the following description, the air flow volume of the air conditioner 8 is described as the setting value to be input.

However, the setting value to be input is not limited to the air flow volume and may be temperature. The setting value may also be a type of vent or a type of mode. Furthermore, when the electronic device to be operated is an audio playback device, the operation input unit 3 can be operated to, e.g., set the volume or scroll the menu, etc.

The operation input device 1 is provided with, e.g., a control unit 4 which obtains a direction and traced amount of the tracing operation based on plural ON signals (ON signal $S_1$ to ON signal $S_8$) output from the plural mechanical switches and controls the electronic device to be operated according to the obtained direction and traced amount of the tracing operation, as shown in FIG. 2A.

(Configuration of the Switches 2a to 2h)

The switches 2a to 2h are, e.g., aligned in a row from left to right in the paper plane of FIGS. 1A and 1B. Since the switches 2a to 2h have the same principal configuration, the configuration of a switch 2 will be described below as an example.

The switch 2 has, e.g., an operating portion 20, a movable contact 22, a fixed contact 23, two supports 25, and two coil springs 26, as shown in FIG. 2B.

The operating portion 20 has, e.g., a main body 200 having a quadrangular prism shape, an operation button 201 protruding from the top of the main body 200, and an electrode portion 202 provided at the bottom of the main body 200, as shown in FIGS. 2B and 2C. The operation button 201 corresponds to operation buttons 201a to 201h of the switches 2a to 2h.

Two supporting holes 205 are provided on the main body 200. The supports 25 having, e.g., a columnar shape are inserted into the supporting holes 205. The operating portion 20 moves while being guided by the supports 25.

The operation button 201 has, e.g., a shape formed by longitudinally cutting a column, as shown in FIG. 1C. The upper surface of the operation button 201 serves as an operation surface 21. The operation surface 21 bulges in the middle and has an elliptical shape when viewed from a side.

The operation button 201 has, e.g., a protruding length H from a surface 70 of a housing 7, a width W and a depth D shown in FIG. 1C, which are the same for the switches 2a to 2h.

The electrode portion 202 has the movable contact 22 at the bottom. The movable contact 22 faces, e.g., the fixed contact 23 provided on a bottom surface 71 of the housing 7 and the switch is turned on by depressing the operation button 201. The switch 2 is configured to output an ON signal when the movable contact 22 touches the fixed contact 23.

The switch 2 may be provided with, e.g., a conductive rubber dome having the movable contact 22. In the switch 2 in this case, the operation button 201 returns to the pre-operation position by an elastic force of the rubber dome instead of by the coil springs 26.

The two coil springs 26 for applying an elastic force to the operating portion 20 are arranged between the main body 200 and the bottom surface 71 of the housing 7. The supports 25 are inserted into the coil springs 26. When the operation surface 21 is pressed, the coil springs 26 are compressed via the main body 200. Then, once an operating finger 9 is separated away from the operation surface 21, the accumulated elastic force of the coil springs 26 is released in the switch 2, causing the operating portion 20 to return to its original position before being pressed.

(Configuration of the Control Unit 4)

The control unit 4 is, e.g., a microcomputer composed of a CPU (Central Processing Unit) performing calculation and processing, etc., of the acquired data according to a stored program, a RAM (Random Access Memory) and a ROM (Read Only Memory) as semiconductor memories, etc. The ROM stores, e.g., a program for operation of the control unit 4. The RAM is used as, e.g., a storage area for temporarily storing calculation results, etc.

The control unit 4 is, e.g., electrically connected to the switches 2a to 2h, as shown in FIG. 2A. The control unit 4 generates operation information $S_9$ based on the ON signals $S_1$ to $S_8$ output from the switches 2a to 2h and outputs the information $S_9$ to the electronic device (the air conditioner 8) to be operated.

When an operator performs, e.g., a tracing operation from the switch 2a to the switch 2e in a direction from left to right to increase the air flow volume as shown in FIG. 1B, the ON signals $S_1$ to $S_5$ are output in the order in which the switches are turned on.

With regard to the determination operation:

The control unit 4 determines, e.g., the switches which output the ON signals, based on the input ON signals. Then, the control unit 4 determines, e.g., a direction of the tracing operation based on the order in which the switches are turned on, and also the traced amount based on the number of switches which have been turned on.

In detail, the control unit 4 determines that the direction of the tracing operation is from left to right based on the fact that the ON signals output from the switches 2a to 2e are input in the order of the ON signal $S_1$ to the ON signal $S_5$, and the control unit 4 also obtains the traced amount based on the number of switches (five). Based on the fact that, e.g., the total number of the switches is eight and the five switches are operated, the control unit 4 calculates (5/8)α as the detected traced amount where α is the full traced amount when the all switches are traced. When the full traced amount is, e.g., 10, the control unit 4 calculates (5/8)×10 and obtains the detected traced amount (6.25).

The operation input device 1 may be configured such that when the setting value is large, the intended setting is achieved by tracing the operation input unit 3 several times.

(Effects of the First Embodiment)

The operation input device 1 in the first embodiment allows easy input even when wearing a glove and also can provide an excellent operational feeling. In detail, the operation input device 1 allows input regardless of wearing or not wearing a glove and is configured that the switches 2a to 2h as the mechanical switches capable of giving feedback on the operation are arranged side by side and receive an input made by a tracing operation in a one-dimensional direction. In addition, since the operation input device 1 is configured that the operation surface 21 is a curved surface which is similar to a side surface of a column, the operating finger 9 does not get stuck and can smoothly perform an operation even when continuously performing the tracing operation. That is, the operation input device 1 allows easy input even when wearing a glove and also can provide an excellent operational feeling as compared to when detecting a tracing operation by a capacitive touch pad.

The capacitive touch pad needs to be highly controlled since, e.g., sensitivity of detection needs to be adjusted depending on the condition such as bare hand or gloved hand and also the detected capacitance is different depending on environment such as temperature. Unlike this, the operation input device 1 can easily calculate a direction and traced amount of the tracing operation based on the ON signals output from the switches aligned in a row.

Since the operation input device 1 is configured that the two supports 25 are arranged in a direction intersecting a direction of the tracing operation and the operating portion 20 is supported by the supports 25 as shown in FIG. 2C, the operating portion 20 does not collapse during the tracing operation and operability is good.

Since the plural switches are arranged side by side in the operation input device 1, the level differences at boundaries are recognizable and it is thus easy to know the traced amount as compared to when portions between switches are flat without level differences at boundaries.

Since the operation input device 1 does not require friction, etc., to produce operational feeling, there is no restriction on surface treatment of the operation surface 21 and the degree of freedom is thus high.

Second Embodiment

The second embodiment is different from other embodiments in that the operation buttons have different protruding lengths H.

Figure 3A:
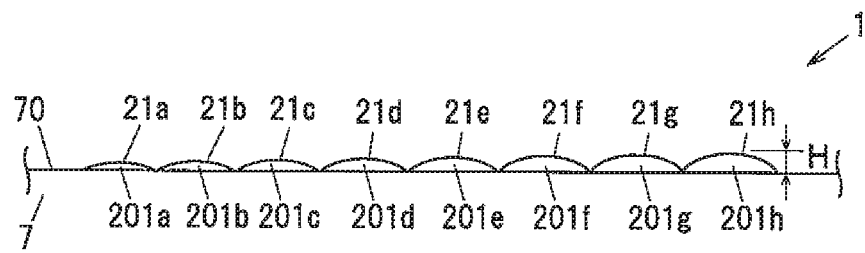
FIG. 3A is a side view showing the operation buttons of the operation input device in the second embodiment.

FIG. 3A is an explanatory diagram illustrating the protruding length of the operation button of the operation input device in the second embodiment. In the embodiments described below, the portions having the same functions and structures as those in the first embodiment are denoted by the same reference numerals and the explanation thereof will be omitted.

The plural mechanical switches of the operation input device 1 in the second embodiment are configured so that, e.g., the operation buttons 201 protruding from the surface 70 of the housing 7 have different protruding lengths H so as to correspond to the magnitude of the setting value to be input, as shown in FIG. 3A.

In this operation input device 1, the protruding length H increases from left to right in the paper plane of FIG. 3A. In the operation input device 1, the setting value also increases from left to right in the paper plane of FIG. 3A.

Increasing the protruding length H as such results in each switch having the operation buttons 201 with different height. Therefore, unlike the case where the protruding lengths H are the same, the operator feels that resistance is increasing during an operation from left to right and resistance is decreasing during an operation from right to left.

In the operation input device 1 of the second embodiment, the protruding length H is different so as to correspond to the setting value. Therefore, unlike the case where the protruding lengths H are constant, it is possible to know the magnitude of the setting value without looking the operation input unit 3.

Third Embodiment

The third embodiment is different from the other embodiments in that the operation surfaces have different widths W.

Figure 3B:
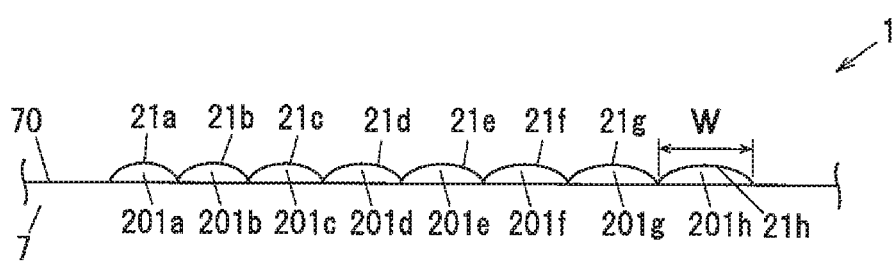
FIG. 3B is a side view showing the operation buttons of the operation input device in the third embodiment.

FIG. 3B is an explanatory diagram illustrating the width of the operation surface of the operation input device in the third embodiment. The plural mechanical switches of the operation input device 1 in the third embodiment are configured so that, e.g., the operation surfaces 21 have different widths W in the operation direction so as to correspond to the magnitude of the setting value to be input, as shown in FIG. 3B.

In this operation input device 1, the width W increases from left to right in the paper plane of FIG. 3B. In the operation input device 1, the setting value also increases from left to right in the paper plane of FIG. 3B.

When the width W increases, an interval to the next operation button increases as the setting value increases and the interval decreases as the setting value decreases. Therefore, the operator can know the magnitude of the setting value based on a difference in operational feeling provided by such different intervals.

As such, in the operation input device 1 of the third embodiment, the width W of the operation surface 21 is different so as to correspond to the setting value. Therefore, unlike the case where the widths W are constant, it is possible to know the magnitude of the setting value without looking the operation input unit 3.

Fourth Embodiment

The fourth embodiment is different from the other embodiments in that an operating load F required to depress the operation button is different for each switch.

Figure 3C:
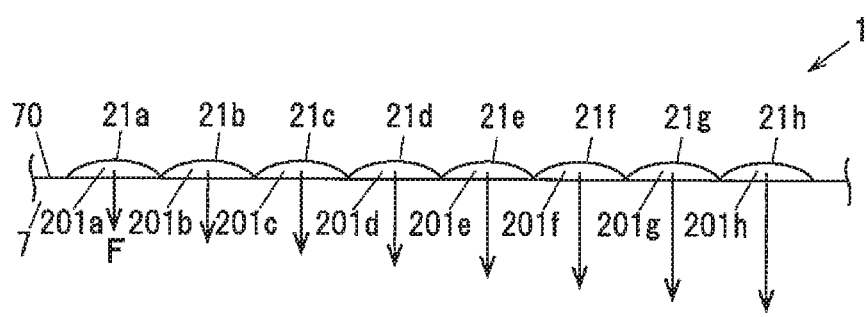
FIG. 3C is a side view showing the operation buttons of the operation input device in the fourth embodiment.

FIG. 3C is an explanatory diagram illustrating the operating loads applied on the operation buttons of the operation input device in the fourth embodiment. In FIG. 3C, the magnitude of the operating load is indicated by length of the arrow.

The plural mechanical switches of the operation input device 1 in the fourth embodiment are configured so that, e.g., the operating loads F required to depress the operation surfaces 21 are different so as to correspond to the magnitude of the setting value to be input, as shown in FIG. 3C.

In this operation input device 1, the operating load F increases from left to right in the paper plane of FIG. 3C. In the operation input device 1, the setting value also increases from left to right in the paper plane of FIG. 3C. The switch may be formed using plural springs requiring different operating loads or may be configured to generate different operating loads using an electromagnet.

When the operating load F increases as such, the operator feels that resistance is increasing during an operation from left to right and resistance is decreasing during an operation from right to left, unlike the case where the operating loads F are the same.

In the operation input device 1 of the fourth embodiment, the operating load F is different so as to correspond to the setting value. Therefore, unlike the case where the operating loads F are constant, it is possible to know the magnitude of the setting value without looking the operation input unit 3.

Fifth Embodiment

The fifth embodiment is different from the other embodiments in the shape of the operation button.

Figure 4A:
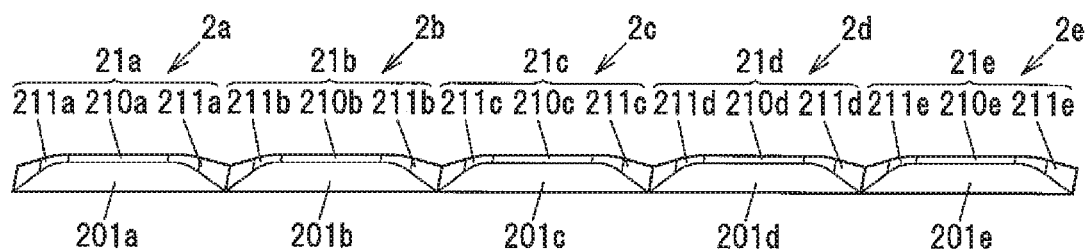
FIG. 4A is a perspective view showing a shape of the operation buttons of the operation input device in the fifth embodiment.
Figure 4B:
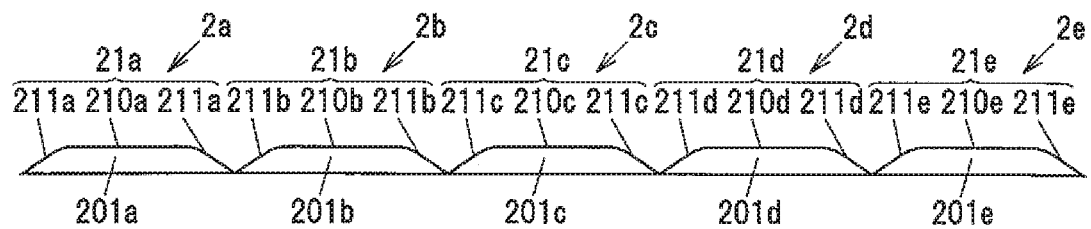
FIG. 4B is a side view showing the shape of the operation buttons of the operation input device in the fifth embodiment.
Figure 4C:
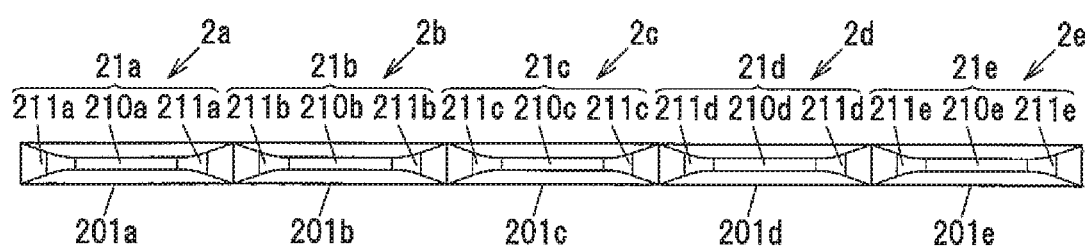
FIG. 4C is a top view showing the shape of the operation buttons of the operation input device in the fifth embodiment.

FIGS. 4A to 4C are explanatory diagrams illustrating the shape of the operation buttons of the operation input device in the fifth embodiment. FIG. 4A is a perspective view as an example. FIG. 4B is a side view as an example. FIG. 4C is a top view as an example.

The plural mechanical switches (the switches 2a to 2e) in the fifth embodiment are configured that, e.g., the operation surfaces (the operation surfaces 21a to 21e) are flat (flat surfaces 210a to 210e) in the middle and curved (curved surfaces 211a to 211e) at both ends, as shown in FIGS. 4A to 4C.

These switches 2a to 2e are configured that, e.g., side surfaces of the operation buttons 201a to 201e are tapered toward the top, as shown in FIGS. 4A to 4C. In addition, since the switches 2a to 2e are curved (have the curved surfaces 211a to 211e) at end portions adjacent to the other switches, the operating finger is less likely to get stuck and can slide thereon easily.

Therefore, when performing the tracing operation on the switches 2a to 2e of the fifth embodiment, it is possible to slide to the next switch without any stress while experiencing click feeling produced by depression of the operation button. In addition, these switches 2a to 2e are excellent in design and are also easy to find the depression point, allowing the operating finger to appropriately stop.

Sixth Embodiment

The sixth embodiment is different from the other embodiments in the shape of the operation button.

Figure 5A:
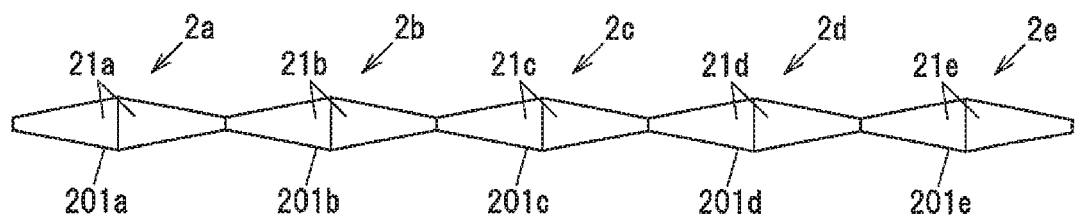
FIG. 5A is a top view showing a shape of the operation buttons of the operation input device in the sixth embodiment.
Figure 5B:
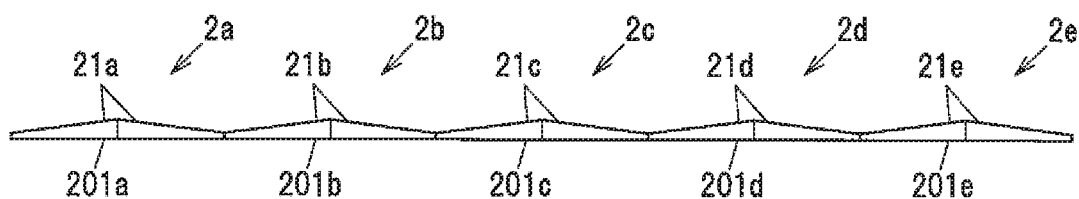
FIG. 5B is a side view showing the shape of the operation buttons of the operation input device in the sixth embodiment.

FIGS. 5A and 5B are explanatory diagrams illustrating the shape of the operation buttons of the operation input device in the sixth embodiment. FIG. 5A is a top view as an example. FIG. 5B is a side view as an example.

The operation buttons (the operation buttons 201a to 201e) of the plural mechanical switches (the switches 2a to 2e) in the sixth embodiment have, e.g., a shape tapered toward both ends, as shown in FIGS. 5A and 5B.

In other words, the operation buttons 201a to 201e are configured that the operation surfaces 21a to 21e have, e.g., a shape formed by cutting a circular cone in half and connecting the two halves, as shown in FIGS. 5A and 5B.

Thus, the centers of the operation surfaces 21a to 21e of the switches 2a to 2e in the sixth embodiment are high and is easy to feel, and good operational feeling is also provided since an appropriate feeling is provided when moving from one switch to another. In addition, these switches 2a to 2e are excellent in design and are also easy to find the depression point, allowing the operating finger to appropriately stop.

Seventh Embodiment

The seventh embodiment is different from the other embodiments in the shape of the operation button.

Figure 5C:
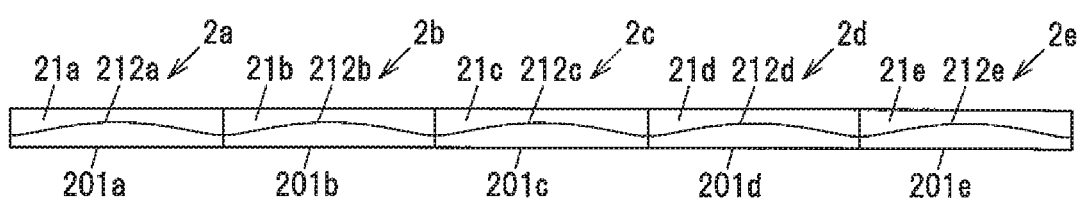
FIG. 5C is a top view showing a shape of the operation buttons of the operation input device in the seventh embodiment.
Figure 5D:
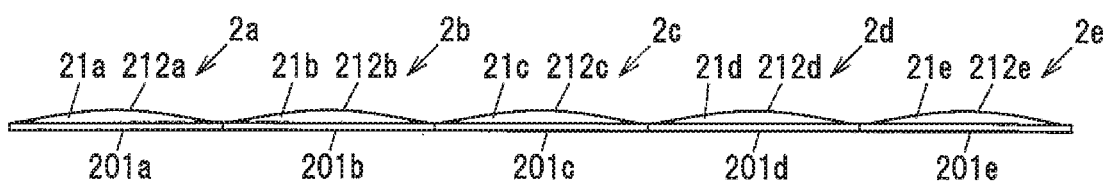
FIG. 5D is a side view showing the shape of the operation buttons of the operation input device in the seventh embodiment.

FIGS. 5C and 5D are explanatory diagrams illustrating the shape of the operation buttons of the operation input device in the seventh embodiment. FIG. 5C is a top view. FIG. 5D is a side view.

The operation buttons (the operation buttons 201a to 201e) of the plural mechanical switches (the switches 2a to 2e) are each configured that an upper portion is thin and a line defined by an apex of the upper portion is curved (curved lines 212a to 212e).

The operation buttons 201a to 201e are, e.g., thinned toward the top so that the apexes produce curved lines (the curved lines 212a to 212e), as shown in FIGS. 5C and 5D. The curved lines provide appropriate stimulus and it is thus easy to feel the change to the next switch.

Thus, when using the switches 2a to 2e in the seventh embodiment, the operating finger comes into contact with mainly the curved lines 212a to 212e of the operation surfaces 21a to 21e, hence, the contact area is small. In addition, the curved lines when viewed from the top makes easy to see the change to the next switch and operational feeling is good.

The operation input device 1 in at least one of the embodiments described above allows easy input even when wearing a glove and also can provide an excellent operational feeling.

As a modification of the embodiments described above, the operation input device 1 may be configured that a predetermined function is executed by push operation on the switch in conjunction with the tracing operation.

Although some embodiments and modifications of the invention have been described above, the embodiments and modifications are merely an example and the invention according to claims is not to be limited thereto. These new embodiments and modifications may be implemented in various other forms, and various omissions, substitutions and changes, etc., can be made without departing from the gist of the invention. In addition, all combinations of the features described in the embodiments and modifications are not necessary to solve the problem of the invention. Further, these embodiments and modifications are included within the scope and gist of the invention and also within the invention described in the claims and the equivalency thereof.

REFERENCE SIGNS LIST

1 OPERATION INPUT DEVICE
2 SWITCH
2a-2h SWITCH
3 OPERATION INPUT UNIT
4 CONTROL UNIT
7 HOUSING
20 OPERATING PORTION
21, 21a-21h OPERATION SURFACE

70 SURFACE
201, 201a-201h OPERATION BUTTON
202 ELECTRODE PORTION
210a-210e FLAT SURFACE
211a-211e CURVED SURFACE
212a-212e CURVED LINE

The invention claimed is:

1. An operation input device, comprising an operation input unit that is configured to receive a tracing operation performed in a one-dimensional direction,
  wherein the operation input unit comprises a plurality of mechanical switches that are arranged side by side in an operation direction and each comprises an operation surface subjected to the tracing operation, the operation surface of each mechanical switch of the plurality of mechanical switches defining a curved surface along the operation direction,
  wherein a setting value to be input is increased when the tracing operation as the operation direction in a first direction is input to the operation input unit,
  wherein the setting value to be input is decreased when the tracing operation as the operation direction in a second direction, which is opposite to the first direction, is input thereto,
  wherein the operation input device further comprises a control unit that obtains a direction and a traced amount of the tracing operation based on a plurality of ON signals output from the plurality of mechanical switches, and
  wherein the control unit determines an amount of the setting value to be increased or decreased based on the traced amount of the tracing operation to be calculated from a number of all of the plurality of mechanical switches and a number of the output plurality of ON signals.

2. The operation input device according to claim 1, wherein each of the plurality of mechanical switches further comprises:
  an operation button,
  a contact, and
  an elastic member;
  wherein the operation button of each of the plurality of mechanical switches includes the operation surface of its corresponding mechanical switch,
  wherein the operation button of each of the plurality of mechanical switches is depressed via the operation surface of its corresponding mechanical switch during the tracing operation,
  wherein the contact of each of the plurality of mechanical switches is arranged under the operation button of its corresponding mechanical switch and is configured to be actuatable when the operation button of its corresponding mechanical switch is depressed, and
  wherein the elastic member of each of the plurality of mechanical switches applies repulsive force to the operation button of its corresponding mechanical switch when actuating the contact of its corresponding mechanical switch by depressing the operation button of its corresponding mechanical switch.

3. The operation device according to claim 2, wherein the plurality of mechanical switches are configured such that their respective operation buttons protrude from a surface of a housing at different protruding lengths with respect to each other so as to correspond to a magnitude of the setting value to be input.

4. The operation input device according to claim 3, wherein the plurality of mechanical switches are configured such that their respective protruding lengths gradually increase with respect to each other in the first direction.

5. The operation input device according to claim 2, wherein the operation buttons of the plurality of mechanical switches have a shape tapered toward both ends.

6. The operation input device according to claim 2, wherein the operation buttons of the plurality of mechanical switches are each configured such that an upper portion is thin and a line defined by an apex of the upper portion is curved.

7. The operation device according to claim 1, wherein the plurality of mechanical switches are configured such that their respective operation surfaces have different widths in the operation direction so as to correspond to a magnitude of the setting value to be input.

8. The operation input device according to claim 7, wherein the plurality of mechanical switches are configured such that the widths of their respective operation surfaces gradually increase with respect to one another in the first direction.

9. The operation input device according to claim 1, wherein the plurality of mechanical switches are configured such that operating loads required to depress the operation surfaces of each of the plurality of mechanical switches are different so as to correspond to the a magnitude of the setting value to be input.

10. The operation input device according to claim 9, wherein the plurality of mechanical switches are configured such that the operating loads of the plurality of mechanical switches gradually increase in the first direction with respect to one another.

11. The operation input device according to claim 1, wherein the operation surfaces of the plurality of mechanical switches are flat in a middle and curved at both ends.

12. An operation input device, comprising an operation input unit that is configured to receive a tracing operation performed in a one-dimensional direction,
  wherein the operation input unit comprises a plurality of mechanical switches that are arranged side by side in the one-dimensional direction and wherein each mechanical switch of the plurality of mechanical switches comprises an operation surface subjected to the tracing operation, the operation surface of each mechanical switch of the plurality of mechanical switches defining a curved surface along the one-dimensional direction, wherein the curved surface of each mechanical switch of the plurality of mechanical switches comprises a quadric surface;
  wherein the operation input device further comprises a control unit that obtains a direction and a traced amount of the tracing operation based on a plurality of ON signals output from the plurality of mechanical switches, and
  wherein the control unit determines an amount of a setting value to be increased or decreased based on the traced amount of the tracing operation to be calculated from a number of all of the plurality of mechanical switches and a number of the output plurality of ON signals.

* * * * *